(12) United States Patent
Brown et al.

(10) Patent No.: US 8,221,602 B2
(45) Date of Patent: Jul. 17, 2012

(54) NON-CONTACT PROCESS KIT

(75) Inventors: Karl Brown, Mountain View, CA (US); Puneet Bajaj, Karnataka (IN)

(73) Assignee: Applied Materials, Inc., Santa Clara, CA (US)

( * ) Notice: Subject to any disclaimer, the term of this patent is extended or adjusted under 35 U.S.C. 154(b) by 1251 days.

(21) Appl. No.: 11/954,270

(22) Filed: Dec. 12, 2007

(65) Prior Publication Data

US 2008/0141942 A1 Jun. 19, 2008

Related U.S. Application Data

(60) Provisional application No. 60/870,752, filed on Dec. 19, 2006, provisional application No. 60/916,784, filed on May 8, 2007.

(51) Int. Cl.
*C23C 14/34* (2006.01)

(52) U.S. Cl. .............. 204/298.11; 204/298.15; 118/728; 118/729

(58) Field of Classification Search ............. 204/298.11, 204/298.15; 118/728, 729
See application file for complete search history.

(56) References Cited

U.S. PATENT DOCUMENTS

| | | | |
|---|---|---|---|
| 6,051,122 A | 4/2000 | Flanigan | |
| 6,149,784 A * | 11/2000 | Su et al. | 204/298.11 |
| 6,398,929 B1 * | 6/2002 | Chiang et al. | 204/298.11 |
| 6,709,556 B2 * | 3/2004 | Green | 204/298.07 |
| 2003/0049372 A1 | 3/2003 | Cook et al. | |
| 2006/0090706 A1 | 5/2006 | Miller et al. | |
| 2006/0110620 A1 | 5/2006 | Lin et al. | |

FOREIGN PATENT DOCUMENTS

JP 2006-140473 * 6/2006

OTHER PUBLICATIONS

Derwent Abstract to Korea 2004-054055 Publication Date Jun. 2004.*
PCT Search Report and Written Opinion for PCT/US07/87466 dated Mar. 25, 2008, copy consists of 11 pages.
Official Letter dated Jul. 11, 2011, from Chinese Patent Office for corresponding Chinese Patent Application No. 200780047073.4.

* cited by examiner

*Primary Examiner* — Rodney McDonald
(74) *Attorney, Agent, or Firm* — Patterson & Sheridan, LLP

(57) ABSTRACT

A process kit for use in a physical vapor deposition (PVD) chamber, along with a PVD chamber having a non-contact process kit are provided. In one embodiment, a process kit includes a generally cylindrical shield that has a substantially flat cylindrical body, at least one elongated cylindrical ring extending downward from the body, and a mounting portion extending upwards from an upper surface of the body. In another embodiment, a process kit includes a generally cylindrical deposition ring. The deposition ring includes a substantially flat cylindrical body, at least one downwardly extending u-channel coupled to an outer portion of the body, an inner wall extending upward from an upper surface of an inner region of the body, and a substrate support ledge extending radially inward from the inner wall.

26 Claims, 6 Drawing Sheets

NON-CONTACT PROCESS KIT

CROSS REFERENCE TO RELATED APPLICATIONS

This application claims benefit of U.S. Provisional Patent Application No. 60/870,752, filed Dec. 19, 2006 (APPM/11725L) and to U.S. Provisional Patent Application No. 60/916,784, filed May 8, 2007 (APPM/11725L02), both of which are incorporated herein by reference in their entireties.

BACKGROUND OF THE INVENTION

1. Field of the Invention

Embodiments of the invention generally relate to a process kit for a semiconductor processing chamber, and a semiconductor processing chamber having a process kit. More specifically, the invention relates to a process kit that includes a ring and shield suitable for use in a physical vapor deposition chamber.

2. Description of the Related Art

Physical vapor deposition (PVD), or sputtering, is one of the most commonly used processes in the fabrication of electronic devices. PVD is a plasma process performed in a vacuum chamber where a negatively biased target is exposed to a plasma of an inert gas having relatively heavy atoms (e.g., argon (Ar)) or a gas mixture comprising such inert gas. Bombardment of the target by ions of the inert gas results in ejection of atoms of the target material. The ejected atoms accumulate as a deposited film on a substrate placed on a substrate support pedestal disposed within the chamber.

A process kit may be disposed in the chamber to help define a processing region in a desired region within the chamber with respect to the substrate. The process kit typically includes a cover ring, a deposition ring and a ground shield. Confining the plasma and the ejected atoms to the processing region helps maintain other components in the chamber free from deposited materials and promotes more efficient use of target materials, as a higher percentage of the ejected atoms are deposited on the substrate. The deposition ring additionally prevents deposition on the perimeter of the substrate support pedestal. The cover ring is generally used to create a labyrinth gap between the deposition ring and ground shield, thereby preventing deposition below the substrate. The cover ring also may be utilized to assist in controlling deposition at or below the substrate's edge.

Although conventional ring and shield designs have a robust processing history, the reduction in critical dimensions brings increasing attention to contamination sources within the chamber. As the rings and shield periodically contact each other as the substrate support pedestal raises and lowers between transfer and process positions, conventional designs are potential source of particulate contamination.

Moreover, since conventional cover ring designs are generally unconnected to temperature control sources, such as a chamber wall or substrate support pedestal, the temperature of the cover ring may fluctuate during the process cycle. The heating and cooling of the cover ring increases the stress in materials deposited on the cover ring, making the stressed material prone to flaking and particle generation. Thus, the inventors have realized that is would be advantageous to have a process kit that contributed to minimizing chamber contamination.

Therefore, there is a need in the art for an improved process kit.

SUMMARY OF THE INVENTION

The invention generally provides a process kit for use in a physical vapor deposition (PVD) chamber, and a PVD chamber having an interleaving process kit. In one embodiment, a process kit includes an interleaving deposition ring and ground shield. The deposition ring is configured to have a large pedestal contact surface and a plurality of substrate supporting buttons. When installed in a PVD chamber, the interleaving deposition ring and ground shield advantageously are maintained in contact with the substrate support pedestal and chamber walls, thereby promoting excellent and predictable temperature control that substantially minimize process contamination from films deposited thereon. Moreover, the interleaving deposition ring and ground shield advantageously are configured not come into contact during use within the PVD chamber, thereby eliminating a potential source of particle generation present in conventional designs.

In one embodiment, a process kit of the invention includes a generally cylindrical shield that has a substantially flat cylindrical body, at least one elongated cylindrical ring extending downward from the body, and a mounting portion extending upwards from an upper surface of the body.

In another embodiment, a process kit includes a generally cylindrical deposition ring. The deposition ring includes a substantially flat cylindrical body, at least one downwardly extending u-channel coupled to an outer portion of the body, an inner wall extending upward from an upper surface of an inner region of the body, and a substrate support ledge extending radially inward from the inner wall.

In yet another embodiment, a PVD chamber is provided that includes an interleaving ground shield and deposition ring configured not to touch during use of the PVD chamber.

DESCRIPTION OF THE DRAWINGS

A more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The invention generally provides a process kit for use in a physical vapor deposition (PVD) chamber. The process kit advantageously has reduced potential for generating particulate contamination, which promotes greater process uniformity and repeatability along with longer chamber component service life.

Figure 1:
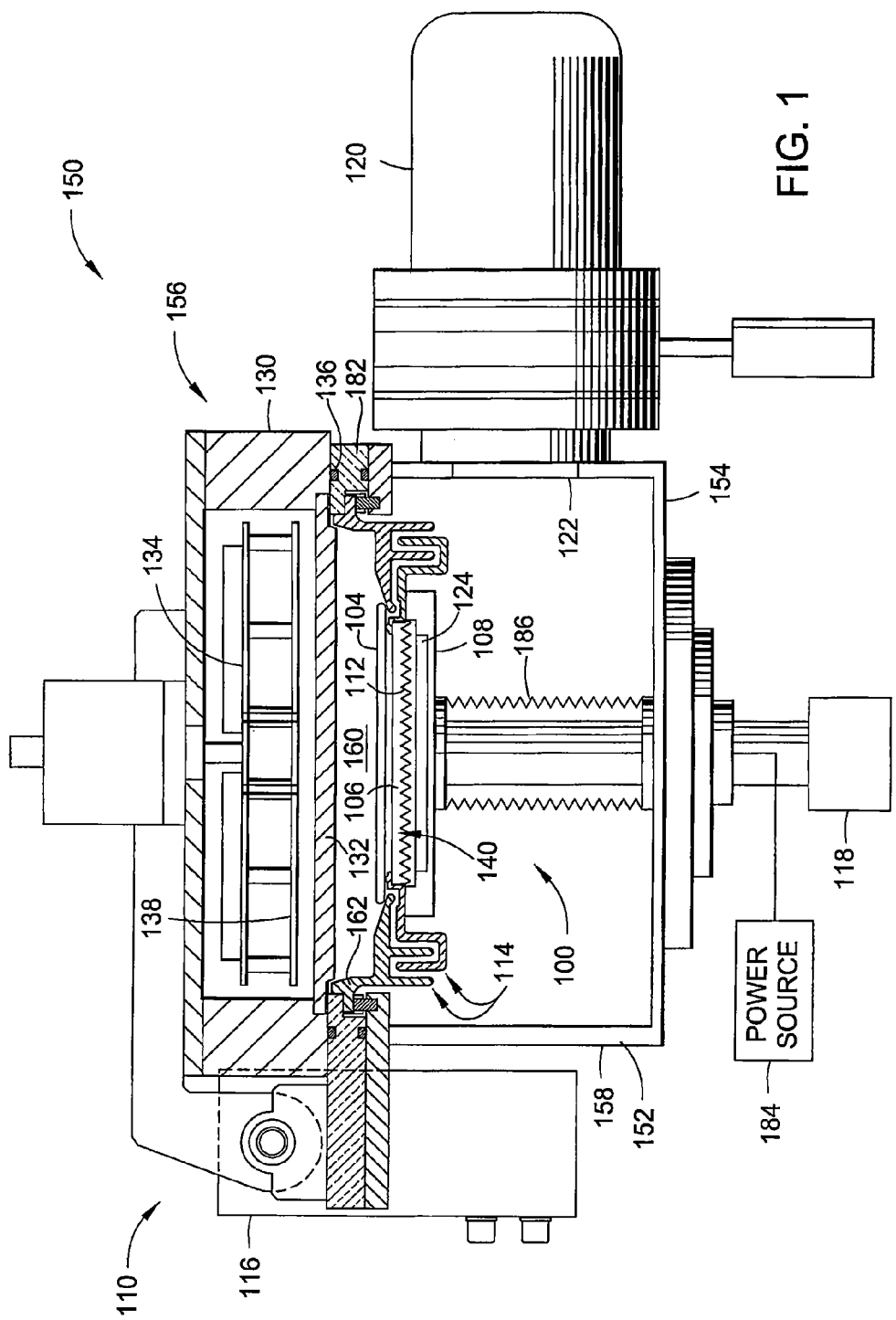
FIG. 1 is a simplified sectional view of a semiconductor processing system having one embodiment of a process kit.

FIG. 1 depicts an exemplary semiconductor processing chamber 150 having one embodiment of a process kit 114.

The process kit 114 includes an interleaving deposition ring 102 and ground shield 162. One example of a processing chamber that may be adapted to benefit from the invention is an IMP VECTRA™ PVD processing chamber, available from Applied Materials, Inc., of Santa Clara, Calif. It is contemplated that other processing chambers, including those from other manufacturers, may be adapted to benefit from the invention.

The exemplary processing chamber 150 includes a chamber body 152 having a bottom 154, lid assembly 156 and sidewalls 158 that define an evacuable interior volume 160. The chamber body 150 is typically fabricated from welded plates of stainless steel or a unitary block of aluminum. The sidewalls 158 generally contain a sealable access port (not shown) to provide for entry and egress of a substrate 104 from the processing chamber 150. A pumping port 122 disposed in the sidewalls 158 is coupled to a pumping system 120 that exhausts and controls the pressure of the interior volume 160. The lid assembly 156 of the chamber 150 generally supports the annular shield 162 that interleaves with the deposition ring 102 to confine a plasma formed in the interior volume 160 to the region above the substrate 104.

A pedestal assembly 100 is supported from the bottom 154 of the chamber 150. The pedestal assembly 100 supports the deposition ring 102 along with the substrate 104 during processing. The pedestal assembly 100 is coupled to the bottom 154 of the chamber 150 by a lift mechanism 118 that is configured to move the pedestal assembly 100 between an upper (as shown) and lower position. In the upper position, the deposition ring 102 is interleaved with the shield 162 in a spaced apart relation. In the lower position, the deposition ring 102 is disengaged from the shield 162 to allow the substrate 104 to be removed from the chamber 150 between the ring 102 and shield 162 through the access port disposed in the sidewall 158. Additionally, in the lower position, lift pins (shown in FIG. 2) are moved through the pedestal assembly 100 to space the substrate 104 from the pedestal assembly 100 to facilitate exchange of the substrate 104 with a wafer transfer mechanism disposed exterior to the processing chamber 150, such as a single blade robot (not shown). A bellows 186 is typically disposed between the pedestal assembly 100 and the chamber bottom 154 to isolate the interior volume 160 of the chamber body 152 from the interior of the pedestal assembly 100 and the exterior of the chamber.

The pedestal assembly 100 generally includes a substrate support 140 sealingly coupled to a platform housing 108. The platform housing 108 is typically fabricated from a metallic material such as stainless steel or aluminum. A cooling plate 124 is generally disposed within the platform housing 108 to thermally regulate the substrate support 140. One pedestal assembly 100 that may be adapted to benefit from the invention is described in U.S. Pat. No. 5,507,499, issued Apr. 16, 1996 to Davenport et al., which is incorporated herein by reference in its entirety.

The substrate support 140 may be comprised of aluminum or ceramic. The substrate support 140 may be an electrostatic chuck, a ceramic body, a heater or a combination thereof. In one embodiment, the substrate support 140 is an electrostatic chuck that includes a dielectric body 106 having a conductive layer 112 embedded therein. The dielectric body 106 is typically fabricated from a high thermal conductivity dielectric material such as pyrolytic boron nitride, aluminum nitride, silicon nitride, alumina or an equivalent material.

The lid assembly 156 generally includes a lid 130, a target 132, spacer 182 and a magnetron 134. The lid 130 is supported by the sidewalls 158 when in a closed position, as shown in FIG. 1. Seals 136 are disposed between spacer 182 and the lid 130 and sidewalls 158 to prevent vacuum leakage therebetween.

The target 132 is coupled to the lid 130 and exposed to the interior volume 160 of the processing chamber 150. The target 132 provides material which is deposited on the substrate 104 during a PVD process. The spacer 182 is disposed between the target 132, lid 130 and chamber body 152 to electrically isolate the target 132 from the lid 130 and chamber body 152.

The target 132 and pedestal assembly 100 are biased relative to each other by a power source 184. A gas, such as argon, is supplied to the volume 160 from a gas source (not shown). A plasma is formed between the substrate 104 and the target 132 from the gas. Ions within the plasma are accelerated toward the target 132 and cause material to become dislodged from the target 132. The dislodged target material is deposited on the substrate 104.

The magnetron 134 is coupled to the lid 130 on the exterior of the processing chamber 150. The magnetron 134 includes at least one rotating magnet assembly 138 that promotes uniform consumption of the target 132 during the PVD process. One magnetron which may be utilized is described in U.S. Pat. No. 5,953,827, issued Sep. 21, 1999 to Or et al., which is hereby incorporated by reference in its entirety.

A hinge assembly 110 couples the lid assembly 156 to the processing chamber 150. A motorized actuator 116 may be coupled to the hinge assembly 110 and/or lid 130 to facilitate movement of the lid assembly 156 between an open and closed portion.

Figure 2:
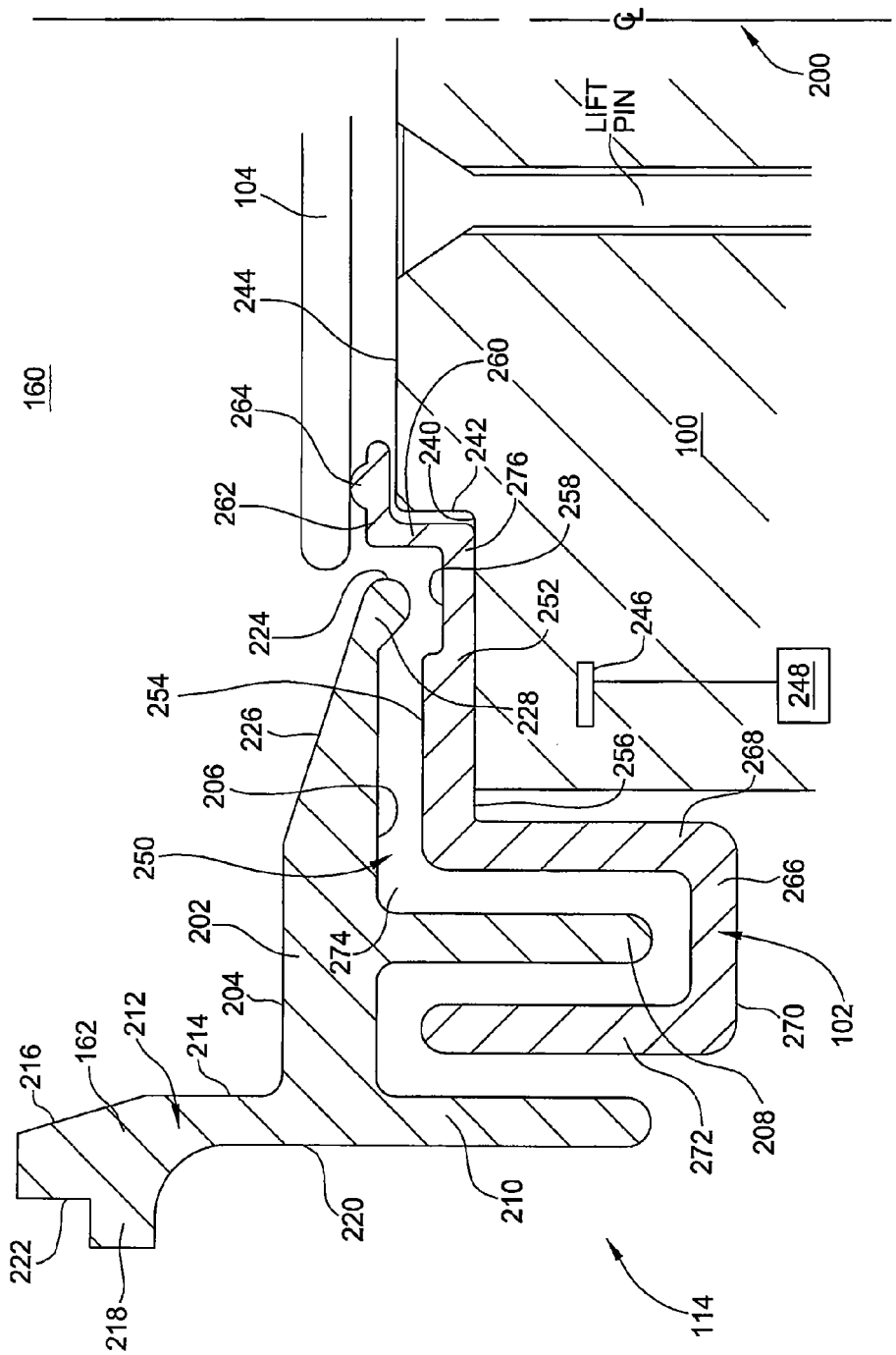
FIG. 2 is a partial sectional view of the process kit interfaced with a substrate support pedestal of FIG. 1.

FIG. 2 is a partial sectional view of the process kit 114 interfaced with the substrate support pedestal assembly 100. Although not shown, the shield 162 of the process kit 114 is mounted to the chamber body 152 at a fixed elevation relative to the lid assembly 156. The deposition ring 102 is shown in an elevated or process position in which a labyrinth gap 250 is defined between the deposition ring 102 and the ground shield 162 to confine the plasma and deposition species within the region defined between the substrate 104 and the target 132. The deposition ring 102 and the ground shield 162 additionally provide a barrier that prevents ejected material from the target 132 from inadvertently depositing on other portions of the chamber. As such, the deposition ring 102 and the ground shield 162 promotes efficient transformation of the target 132 into a material layer deposited on the substrate 104.

The ground shield 162 has a flat substantially cylindrical body 202 and may be fabricated from and/or coated with a conductive material, such as metal. Metals suitable for use as the ground shield 162 include stainless steel and titanium, among others. The material selected for the ground shield 162 should be selected to be compatible with processes preformed within the chamber. The body 202 is mounted to the chamber body 152 such that the centerlines of the body 202 and pedestal assembly 100 are substantially concentric. Centerline 200 of the body 202 shown in the embodiment of FIG. 2 and is oriented in a substantially vertical orientation. The position of the centerline 200 is merely illustrative and, along with other features of the Figures, is not to scale.

The body 202 includes an upper surface 204, a lower surface 206, an outer wall 220 and an inside edge 224. In the embodiment depicted in FIG. 2, the upper surface 204 and lower surface 206 are substantially perpendicular to the centerline 200, except for a sloped surface 226 of the upper surface 204 that slants downward towards the inside edge 224 of the body 202.

Inner and outer rings 208, 210 extend downward from the lower surface 206. The rings 208, 210 are generally elongated cylinders (as compared to the generally shape of the body 202). In the embodiment depicted in FIG. 2, the rings 208, 210 are orientated in a generally parallel, spaced apart relation. The outer ring 210 may also have an outer diameter that is the same as an outer diameter of the outer wall 220.

A mounting section 212 extends upward from the upper surface 204 along the outer wall 220. The mounting section 212 includes an inner wall 214, and an inner taper 216, an outer wall 222 and a mounting flange 218. The inner wall 214 extends upwards in a substantially perpendicular orientation from the upper surface 204 to the inner taper 216. The inner taper 216 extends upward and outward to provide clearance between the shield 162 and the target 130 (shown in FIG. 1). The outer wall 222 generally has a diameter greater than the outer diameter of the outer wall 220 of the body 202.

The mounting flange 218 extends outward from the outer wall 222 and engages the body 152 and/or lid assembly 156 to secure the shield 162 in position. The mounting flange 218 may includes a plurality of holes and/or slots to facilitate coupling to the body 152 and/or lid assembly 156. As the body 152 and/or lid assembly 156 to which the shield 162 is mounted is thermally regulated, temperature control of the mounting flange 218 is enabled via conduction.

Some portions of the ground shield 162 may be coated, textured or otherwise treated. In one embodiment, the ground shield 162 is roughened on at least some surfaces. Roughening (e.g., texturizing) may be accomplished by etching, embossing, abrading, bead blasting, grit blasting, grinding or sanding, among other suitable processes. In the embodiment depicted in FIG. 2, all surfaces of the ground shield 162 are bead blasted. The bead blasted surfaces of the ground shield generally have an RA surface finish of about 250 or greater microinches.

The deposition ring 102 has a flat substantially cylindrical body 252 and may be made from a conductive or non-conductive material. In one embodiment, the deposition ring 102 is fabricated from a ceramic material, such as quartz, aluminum oxide or other suitable material.

The body 252 generally includes an outer portion 274, an inner portion 276, a lower surface 256 and an upper surface 254. The upper surface 254 includes a recess 258 that accommodates the lip 228 of the shield 162 when the shield 162 and ring 102 are positioned approximate each other. The lower surface 256 is configured to sit on a ledge 240 formed at the perimeter of the pedestal assembly 100. The lower surface 256 may be flat and/or have a smooth surface finish to promote good thermal contact with the ledge 240. The relatively large (as compared to conventional designs) contact area between the lower surface 256 and ledge 240, along with the relatively thin ring sectional area of the body 252 provides excellent heat transfer between the ring 102 and pedestal assembly 100. As such, the temperature of the ring 102 may be readily maintained at a constant temperature through heat transfer with the pedestal assembly 100.

In one embodiment, one or more temperature control elements 246 may be disposed in the pedestal assembly 100 directly below the ledge 240 to enhance temperature control of the ring 102 independent from features of the pedestal assembly 100 utilized to control the temperature of the substrate 104. The temperature control elements 246 may include one or more of conduits for flowing a heat transfer fluid therethrough, resistive heating elements and the like. The output of the temperature control elements 246 is controlled by one or more appropriate temperature control sources 248, such as a power source, heat transfer fluid supply and the like.

An inner wall 260 extends upward from the inner portion 276 to a substrate supporting flange 262. The inner wall 260 has an inside diameter selected to maintain a gap between the wall 260 and a step 242 coupling the ledge 240 to a top surface 244 of the pedestal assembly 100. The inner wall 260 has a height selected to maintain a gap between the flange 262 of the ring 102 and the top surface 244 of the pedestal assembly 100.

The substrate supporting flange 262 extends inward from the upper end of the inner wall 260 and covers the outer edge of the top surface 244 of the pedestal assembly 100. In one embodiment, the flange 262 is generally perpendicular to the inner wall 260 and parallel to the lower and upper surfaces 256, 254. The flange 262 includes a plurality of substrate support buttons 264 that support the substrate 104 spaced above the upper surface of the flange 262. The buttons 264 may have a rounded shape, a cylindrical shape, a truncated conical shape, or other suitable shape. The buttons 264 minimize the contact between the substrate 104 and ring 102. The minimal contact between the buttons 264 and substrate 104 reduces potential particle generation while minimizing heat transfer between the ring 102 and substrate 104. In one embodiment, three buttons 264 are symmetrically arranged in a polar array and have a height of about 1 mm.

An upwardly facing u-channel 266 is generally formed at the outer portion 274 of the body 274. The u-channel 266 has an inner leg 268 coupled to an outer leg 272 by a bottom 270. The inner leg 268 extends downward from the lower surface 256 of the body 252 and has an inside diameter selected to maintain a gap between the pedestal assembly 100 and the ring 102.

The legs 268, 272 are generally elongated cylinders (as compared to the body 252 of the ring 102). In the embodiment depicted in FIG. 2, the legs 268, 272 are orientated in a generally parallel spaced apart relation and configured to interleave with the inner ring 208 of the ground shield 162.

The spacing the between the legs 268, 272 and inner ring 208 defines the outer region of the labyrinth gap 250. The inner region of the labyrinth gap 250 is defined between the lip 228 of the shield 162 and the wall 260 and recess 258 of the deposition ring 102. The spacing between the lip 228 and deposition ring 102 may be selected to promote or minimize deposition on the side of the substrate 104 facing the pedestal assembly 100.

As the entry into the inner region of the labyrinth gap 250 is partially covered by the substrate 104 and faces away from the trajectory of sputtered target material in the interior volume 160, deposition build up and bridging within the labyrinth gap 250 is less likely to occur as compared to conventional designs, thereby extending the service life between cleanings of the process kit 114. Moreover, as the deposition ring 102 and ground shield 162 of the process kit 114 never come in contact, a potential source of particle generation is eliminated. Furthermore, as the deposition ring 102 and ground shield 162 of the process kit 114 remain in good thermal contact with their supporting structures (e.g., the pedestal assembly 100 and chamber body 152/lid assembly 156), thermal control of the kit 114 is enhanced. The enhanced thermal control enables stress management of films deposited on the kit 114, resulting in less particle generation as compared to conventional designs.

Figure 3:
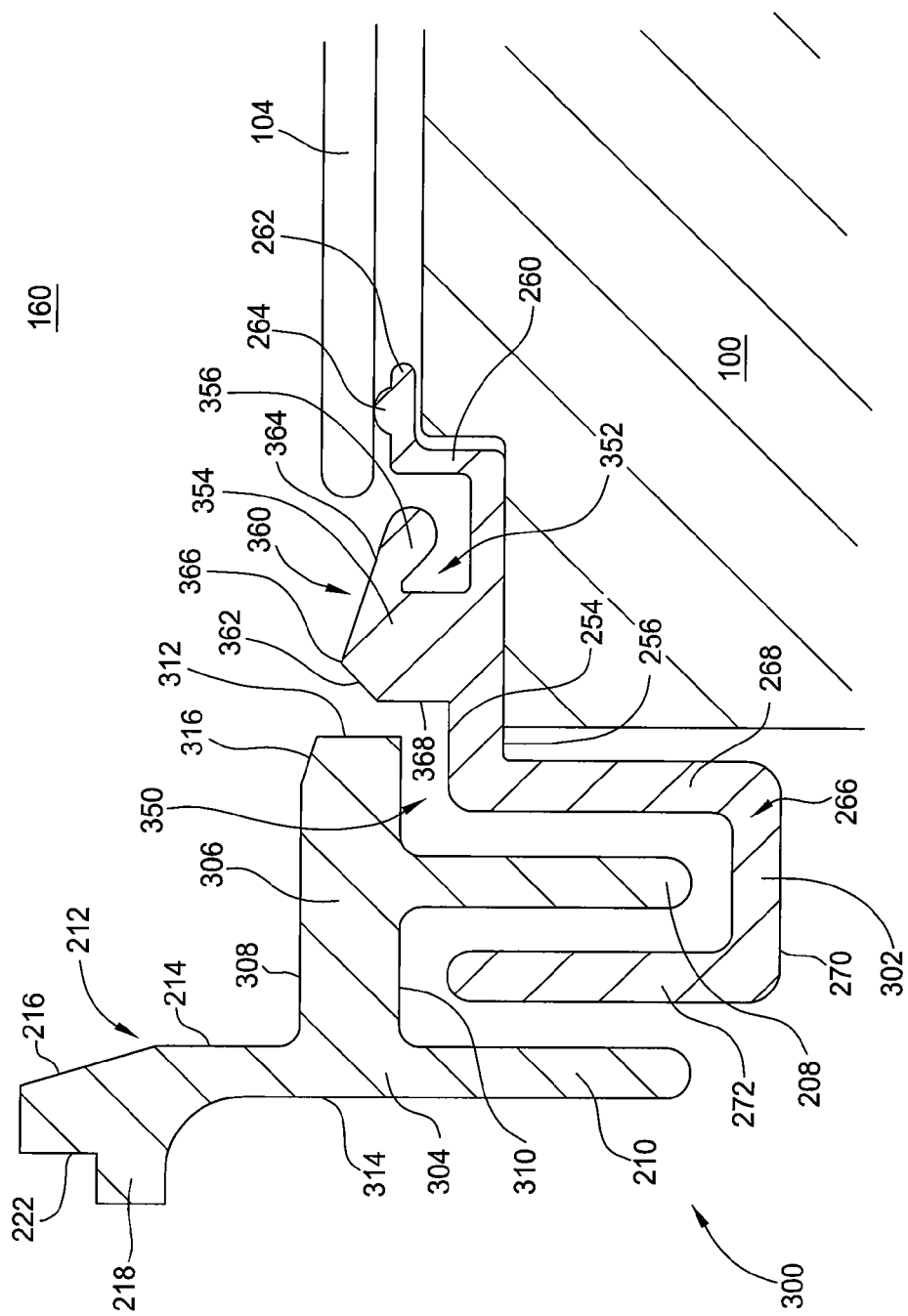
FIG. 3 is a partial sectional view of another embodiment of a process kit interfaced with a substrate support pedestal.

FIG. 3 is a sectional view of another embodiment of a process kit 300 interfaced with a substrate support pedestal 100. The process kit 300 generally includes a deposition ring 302 and a ground shield 304 that are interleaved to form a labyrinth gap 350.

The ground shield 304 is generally similar to the ground shield described above. In the embodiment depicted in FIG. 3, the shield 304 includes a cylindrical body 306 having an upper surface 308, a lower surface 310, an inside edge 312 and an outer wall 314. The upper surface 308 includes a sloped surface 316. The lower surface 310 of the body 306 includes inner and outer rings 208, 210. In one embodiment, the inside edge 312 substantially truncates the sloped surface 316

The deposition ring 302 is generally similar to the deposition ring described above with the addition of a trap 352 formed on an upper surface 254 of the ring 302. The trap 352 is defined between a trap wall 360 and the upper surface 254 of the ring 302.

The trap wall 360 includes a ring 354 extending upward from the upper surface 254 of the ring 302 to a lip 356. The lip 356 extends inward and downward toward junction of the inner wall 260 and upper surface 254. The distal end of the lip 356 is generally closer to the upper surface 254 than the portion of the lip 356 next to the ring 354 such that the upper ceiling of the trap 352 is higher than the distal end of the lip 356. This geometric facilitates capture of deposition material without deposition build-up, thus preventing bridging of the gap defined between the lip 356 and substrate 104.

In one embodiment, the top surface of the ring 354 includes an inner sloped wall 364 and an outer sloped wall 362 that meet at an apex 366. The inner sloped wall 364 extends downward from the apex 366 to the lip 356. The outer sloped wall 362 extends downward from the apex 366 to the outer trap wall 368. The outer sloped wall 362 of the deposition ring 302 and the inside edge 312 of the shield 304 define the entrance to the labyrinth gap 350 from the processing region of the interior volume 160.

The process kit 300 of FIG. 3 decouples the plasma isolation feature via the labyrinth gap 350 from edge deposition control via the trap 352. Additionally, manufacturing costs are reduced with in this embodiment as the distance between inside and outer diameters of the shield 304 is substantially reduced without significant increase to the material need to fabricate the mating deposition ring 302.

Figure 4:
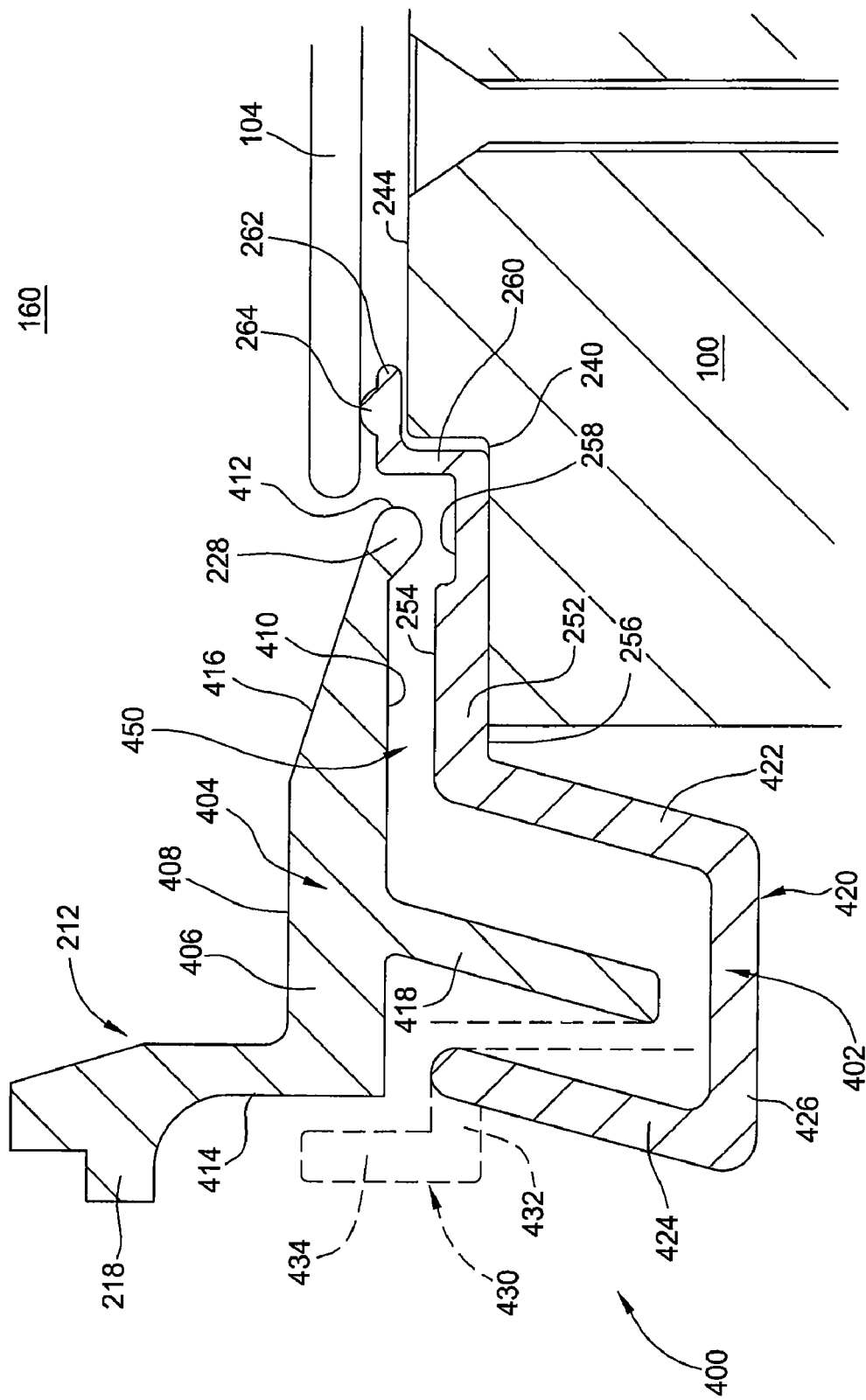
FIG. 4 is a partial sectional view of another embodiment of a process kit interfaced with a substrate support pedestal.

FIG. 4 is a sectional view of another embodiment of a process kit 400 interfaced with a substrate support pedestal 100. The process kit 400 generally includes a deposition ring 402 and a ground shield 404 that are interleaved to form a labyrinth gap 450.

The ground shield 404 is generally similar to the ground shield described above with reference to FIGS. 1-2. In the embodiment depicted in FIG. 4, the shield 404 includes a flat cylindrical body 406 having an upper surface 408, a lower surface 410, an inside edge 412 and an outer wall 414. The upper surface 408 includes a sloped surface 416. The lower surface 410 of the body 406 has a cylindrical ring 418.

The cylindrical ring 418 extends downward and outward and interleaves with the deposition ring 402. In the embodiment depicted in FIG. 4, the ring 418 has an orientation of about 5 to about 35 degrees relative to the centerline of the shield 404.

The deposition ring 402 is generally similar to the deposition ring described above with the addition of an inclined u-channel 420. The u-channel 420 includes an inner leg 422 coupled to an outer leg 424 by a bottom 426. The legs 422, 424 have an orientation of about 5 to about 35 degrees relative to the centerline of the ring 402. In the embodiment depicted in FIG. 4, the legs 422, 424 are oriented at the same angle as the cylindrical ring 418 of the shield 404.

An inside diameter of the distal end of the outer leg 424 is generally selected to clear the distal end of the ring 418 so that the shield 404 and deposition ring 402 may be separated without interference when the pedestal assembly 100 is lowered to facilitate substrate exchange. When the pedestal assembly 100 is raised to a process position as shown in FIG. 4, the legs 422, 424 and ring 418 define an outer portion of the labyrinth gap 450.

Optionally, an extension 430 (shown in phantom) may be formed at the distal end of the outer leg 424. The extension 430 lengthens and adds additional turns to the labyrinth gap 450. The extension 430 includes a flange 432 and terminal ring 434. The flange 432 extends outward from the distal end of the outer leg 424 to the terminal ring 434. The terminal ring 434 has an inner diameter selected to circumscribe the outer wall 414 of the shield 404 in a spaced apart relation when the pedestal assembly 100 is in the raised position as shown.

The process kit 400 of FIG. 4 is economical to manufacture and possesses advantages over conventional designs as described above.

Figure 5:
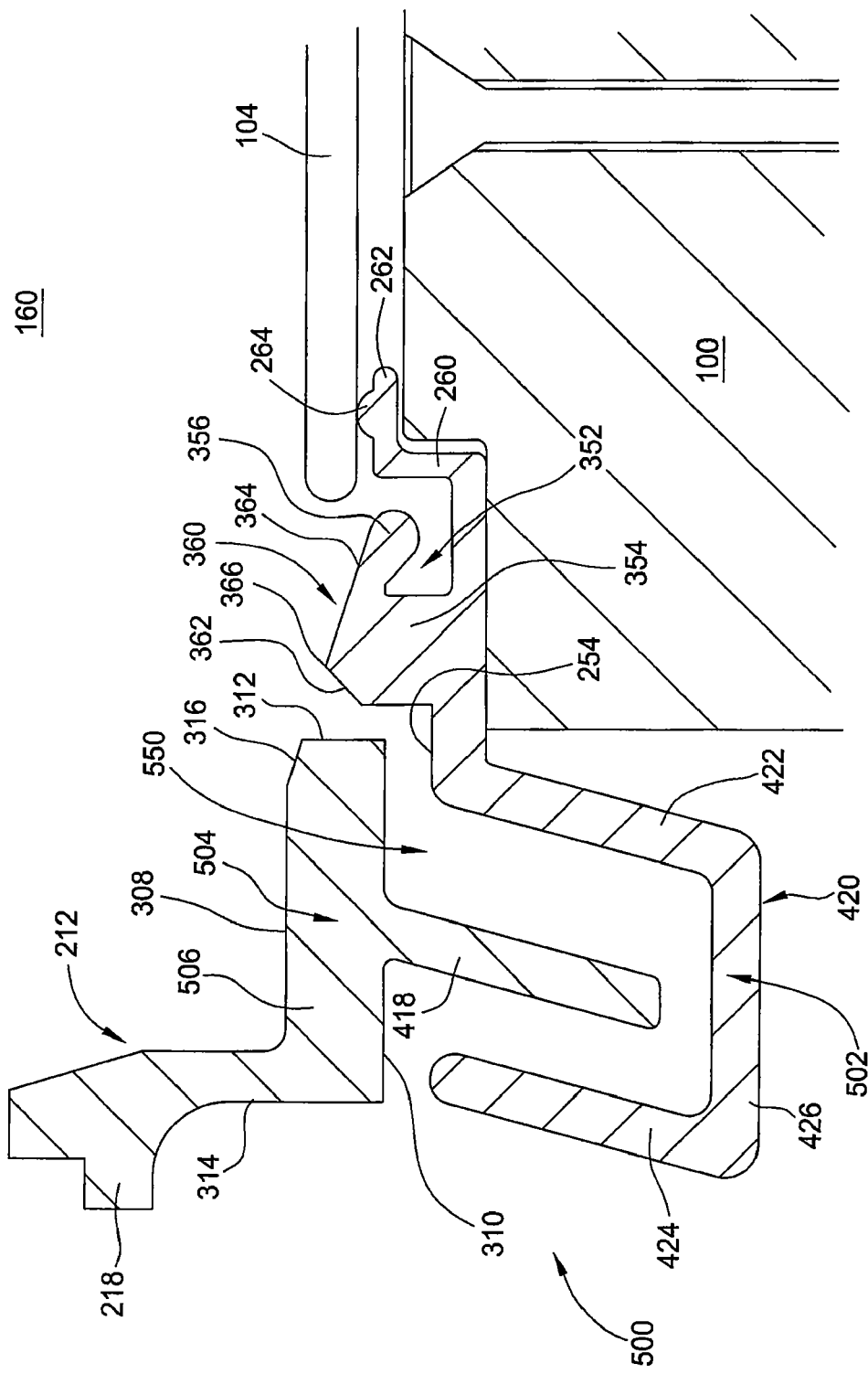
FIG. 5 is a partial sectional view of another embodiment of a process kit interfaced with a substrate support pedestal.

FIG. 5 is a sectional view of another embodiment of a process kit 500 interfaced with a substrate support pedestal 100. The process kit 500 generally includes a deposition ring 502 and a ground shield 504 that are interleaved to form a labyrinth gap 550.

The ground shield 504 is generally similar to the ground shield described above with reference to FIGS. 3-4. In the embodiment depicted in FIG. 5, the shield 504 includes a cylindrical body 506 having an upper surface 308, a lower surface 310, an inside edge 312 and an outer wall 314. The upper surface 308 includes a sloped surface 316. The lower surface 310 of the body 306 includes a cylindrical ring 418. The cylindrical ring 418 extends downward and outward and interleaves with the deposition ring 502.

The inside portion of the deposition ring 502 is generally similar to the deposition ring 302 described above with reference to FIG. 3. The ring 502 includes a trap 352 formed on an upper surface 254 of the ring 502. The trap 352 is defined between a trap wall 360 and the upper surface 254. The trap wall 360 includes a ring 354, a lip 356, and sloped walls 262, 264 meeting at an apex 366.

The outer portion of the deposition ring 502 is generally similar to the deposition ring 402 described above with reference to FIG. 4. The ring 502 includes an inclined u-channel 420. The u-channel 420 includes an inner leg 422 coupled to an outer leg 424 by a bottom 426. The legs 422, 424 are configured to interleave with the cylindrical ring 418 of the shield 504 as discussed above.

Figure 6:
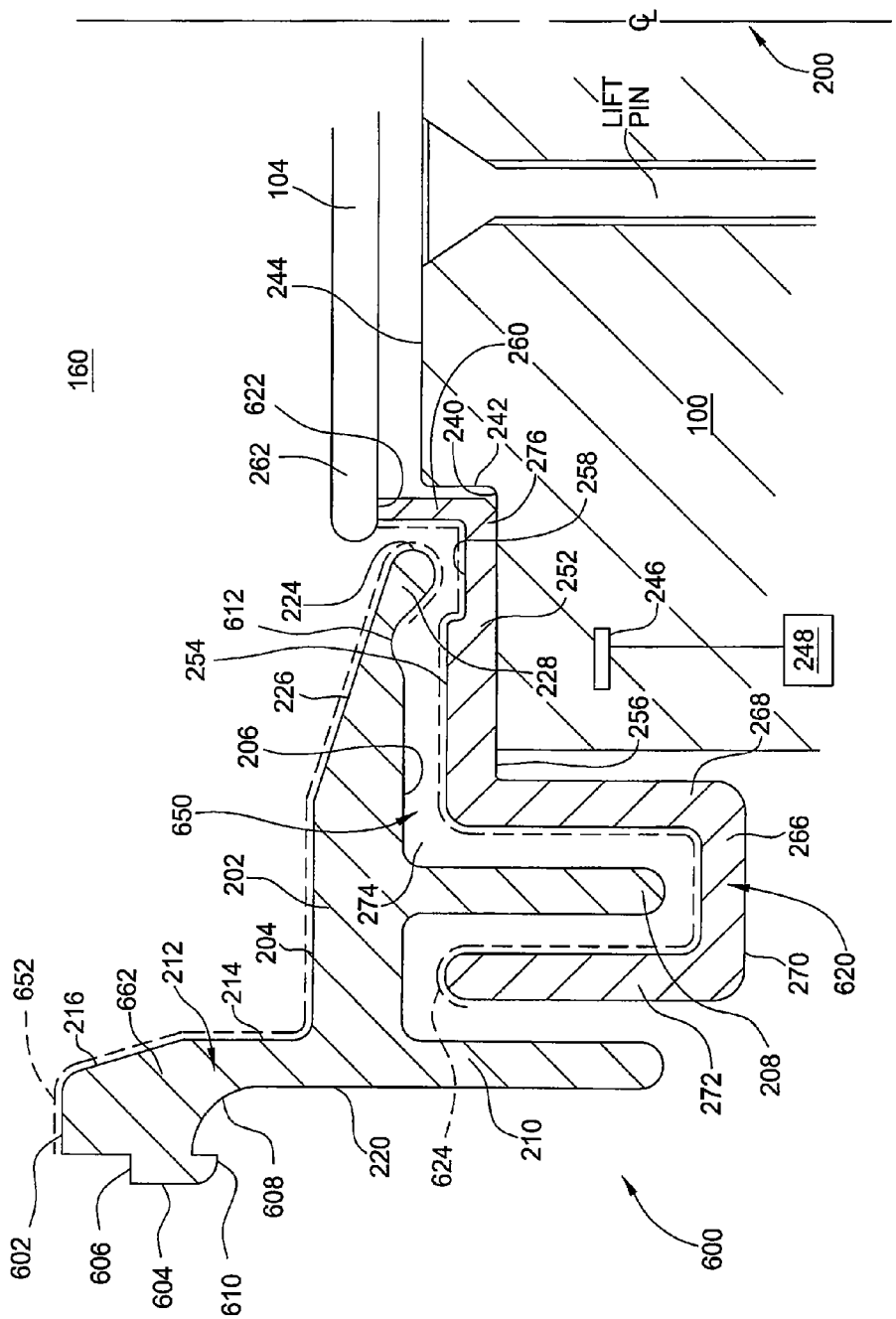
FIG. 6 is a partial sectional view of another embodiment of a process kit interface with a substrate support pedestal.

FIG. 6 is a sectional view of another embodiment of a process kit 600 interface with a substrate support pedestal 100. The process kit 600 generally includes a deposition ring 620 and a ground shield 662 that are interleaved to form a labyrinth gap 650. The deposition ring 620 and the shield 622 are substantially similar to the deposition ring 102 and ground shield 162 described above, and as such, similar features are provided with identical reference numerals without further description for the sake of brevity.

In the embodiment depicted in FIG. 6, the inner wall 260 of the deposition ring 620 has a substrate support end 622. The substrate support end 622 does not extend radially inward of the inner wall 260. The substrate support end 622 provides a substrate seating surface configured to support the substrate 104 above the surface 244 of the pedestal assembly 100, and in one embodiment, is substantially flat and perpendicular to the center line of the ring 620. In one embodiment, the inner wall 260 has a height of about 0.45 inches. The intersection between the inner wall 260 and the lower surface 256 of the deposition ring flange 262 may be chamfered, for example, at a 45-degree angle, to provide additional clearance with the pedestal assembly 100.

In the embodiment depicted in FIG. 6, the deposition ring 620 may also be texturized on its upper surface, as indicated by dashed line 624. The texturized surface provides improved adhesion of material deposited on the ring 620 so that particles or flakes of deposited material do not easily become detached from the ring 620 and become process contaminants over the course of processing. Such adhered deposited material may be removed from the ring 620 utilizing an in-situ and/or ex-situ cleaning process. In one embodiment, the ring may be texturized as described above.

The ground shield 662 includes a mounting section 212 having a step 606 formed in an upper outer diameter 604. The step 606 couples the outer diameter 604 to a substantially horizontal upper surface 602. A transition radius 608 couples the outer wall 222 of the ground shield 662 and the upper outer wall 604.

A lip 610 extends downward from the upper outer wall 604 and beyond the transition radius 608, as shown in FIG. 6. The lip 610 provides a reduced contact area between the processing chamber and the ground shield 662.

The upper inner surface of the ground shield 662 may also be texturized, as indicated by dashed line 654. As discussed above, the textured surface of the ground shield provides improved adhesion of deposition materials so that they may not later become process contaminants.

The lip 228 of the ground shield 662 may also include a recess 612 formed at the transition between the lip 228 and the lower surface 206 of the shield body 202. the recess 612 provides extra clearance between the shield 662 and the ring 620 to accommodate a large amount of material deposited in the recess 258 of the ring 620.

As with the process kits described above, the process kit 600 of FIG. 6 is economical to manufacture and possesses advantages over conventional designs as described above.

Thus, a process kit for a PVD process chamber has been described that advantageously reduces the potential for particulate generation as the ground shield and deposition ring of the process kit do not contact during operation. Moreover, as the shield and ring of the kit are maintained in contact with surfaces that are temperature controlled, the temperature of the process kit may be controlled to reduce and/or eliminate thermal cycling, thereby allowing management of stress included in materials deposited on the process kit. Furthermore, the process kit of the present invention provides an attractive cost of fabrication due to a compact design and elimination of the third ring present in conventional process kits.

While the foregoing is directed to the preferred embodiment of the present invention, other and further embodiments of the invention may be devised without departing from the basic scope thereof, and the scope thereof is determined by the claims that follow.

What is claimed is:

1. A process kit, comprising:
a generally cylindrical shield comprising:
a substantially flat cylindrical body having an upper surface tapering down to an inner end, wherein the body further comprises:
a sloped surface extending downward from the upper surface; and
a second lip extending downward from the sloped surface;
at least one elongated cylindrical ring extending downward from the body; and
a mounting portion extending upwards from the upper surface of the body from an outer wall of the body, the mounting portion having a mounting flange extending radially outward beyond the outer wall of the body, the mounting flange and the outer wall of the body defining a first lip; an inner wall extending from the upper surface of the body, and an inner taper that flares radially outward and upwards from the inner wall.

2. The process kit of claim 1, wherein the body is fabricated from at least one of stainless steel or titanium.

3. The process kit of claim 1, wherein the body is fabricated from or coated with a conductive material.

4. The process kit of claim 1, wherein at least a portion of the body has a surface treatment.

5. The process kit of claim 1, wherein at least a portion of the body has a bead blasted surface.

6. The process kit of claim 1, wherein the at least one elongated cylindrical ring has a perpendicular orientation relative to a centerline of the body.

7. The process kit of claim 1, wherein the at least one elongated cylindrical ring has an orientation of about 5 to about 35 degrees relative to a centerline of the body.

8. The process kit of claim 1, wherein the at least one elongated cylindrical ring further comprises:
an inner ring; and
an outer ring spaced in a substantially parallel relation to the inner ring.

9. The process kit of claim 1, wherein the inner end of the body truncates a sloped surface, and wherein the inner end is substantially parallel to a centerline of the body.

10. The process kit of claim 1 further comprising:
a generally cylindrical deposition ring comprising:
a substantially flat cylindrical body having an upper surface and a lower surface, the lower surface configured to be supported on a ledge of a substrate support pedestal;
at least one downwardly extending u-channel coupled to an outer portion of the body;
an inner wall extending upward from the upper surface of an inner region of the body and having a substrate support surface; and
a substrate support ledge extending radially inward from the inner wall.

11. The process kit of claim 10, wherein the deposition ring further comprises:
a ledge extending radially inward from the inner wall; and
a plurality of buttons disposed on an upper surface of the ledge and defining the substrate support surface.

12. The process kit of claim 11, wherein the plurality of buttons further comprises:
three buttons equally spaced apart in a polar array.

13. The process kit of claim 10, wherein the u-channel is configured to interleave with the at least one ring of the shield.

14. The process kit of claim 10, wherein the u-channel further comprises:
a first leg coupled to the body of the deposition ring;
a second leg spaced outward from the first leg; and
a bottom joining the legs.

15. The process kit of claim 14, wherein the legs are substantially parallel to a centerline of the deposition ring.

16. The process kit of claim 14, wherein the legs have an orientation of about 5 to about 35 degrees relative to a centerline of the deposition ring.

17. The process kit of claim 10, wherein the body of the deposition ring further comprises:
a trap wall extending upwards from the upper surface of the deposition ring; and a lip extending inward and downward from the trap wall to overhang an inner portion of the upper surface of the deposition ring.

18. The process kit of claim 17, wherein an upper surface of the trap wall further comprises:
an inner sloped wall meeting an outer sloped wall at an apex.

19. A process kit comprising:
a generally cylindrical deposition ring comprising:
   a substantially flat cylindrical body having an upper surface and a lower surface, the lower surface configured to be supported on a ledge of a substrate support pedestal;
   at least one downwardly extending u-channel coupled to an outer portion of the body;
   an inner wall extending upward from the upper surface of an inner region of the body and having a substrate support surface;
   a ledge extending radially inward from the inner wall; and
   a plurality of buttons disposed on an upper surface of the ledge and defining the substrate support surface.

20. The process kit of claim 19, wherein the plurality of buttons further comprises:
three buttons equally spaced apart in a polar array.

21. The process kit of claim 19, wherein the u-channel is facing upwards.

22. The process kit of claim 19, wherein the u-channel further comprises:
a first leg coupled to the body of the deposition ring;
a second leg spaced outward from the first leg; and
a bottom joining the legs.

23. The process kit of claim 22, wherein the legs are substantially parallel to a centerline of the deposition ring.

24. The process kit of claim 22, wherein the body is fabricated from at least one of stainless steel or titanium.

25. The process kit of claim 19, wherein the body of the deposition ring further comprises:
a trap wall extending upwards from the upper surface of the deposition ring; and
a lip extending inward and downward from the trap wall to overhang an inner portion of the upper surface of the deposition ring.

26. The process kit of claim 25, wherein an upper surface of the trap wall further comprises:
an inner sloped wall meeting an outer sloped wall at an apex.

* * * * *